(12) United States Patent
Gopalan et al.

(10) Patent No.: US 11,580,396 B2
(45) Date of Patent: Feb. 14, 2023

(54) SYSTEMS AND METHODS FOR ARTIFICIAL INTELLIGENCE DISCOVERED CODES

(71) Applicant: Aira Technologies, Inc., Saratoga, CA (US)

(72) Inventors: RaviKiran Gopalan, Cupertino, CA (US); Anand Chandrasekher, Saratoga, CA (US); Yihan Jiang, Cupertino, CA (US)

(73) Assignee: Aira Technologies, Inc., Saratoga, CA (US)

( * ) Notice: Subject to any disclaimer, the term of this patent is extended or adjusted under 35 U.S.C. 154(b) by 0 days.

(21) Appl. No.: 17/069,794

(22) Filed: Oct. 13, 2020

(65) Prior Publication Data

US 2022/0114436 A1   Apr. 14, 2022

(51) Int. Cl.
*G06N 3/08* (2006.01)
*G06N 3/04* (2006.01)
*H03M 13/09* (2006.01)

(52) U.S. Cl.
CPC ............. *G06N 3/08* (2013.01); *G06N 3/0445* (2013.01); *H03M 13/09* (2013.01)

(58) Field of Classification Search
CPC ........ G06N 3/08; G06N 3/0445; H03M 13/09
See application file for complete search history.

(56) References Cited

U.S. PATENT DOCUMENTS

| 5,910,182 | A | 6/1999 | Dent | |
| 5,968,197 | A | 10/1999 | Doiron | |
| 10,749,594 | B1 * | 8/2020 | O'Shea | H04B 7/18513 |
| 11,088,784 | B1 | 8/2021 | Gopalan et al. | |
| 11,191,049 | B1 | 11/2021 | Chandrasekher et al. | |
| 11,418,287 | B2 | 8/2022 | Gopalan et al. | |
| 2002/0026523 | A1 | 2/2002 | Mallory et al. | |
| 2002/0122510 | A1 * | 9/2002 | Yakhnich | H04L 25/067 375/342 |
| 2004/0170120 | A1 | 9/2004 | Reunamaki et al. | |

(Continued)

FOREIGN PATENT DOCUMENTS

GB   2493081 A   1/2013

OTHER PUBLICATIONS

Goutay, Mathieu, Fayçal Ait Aoudia, and Jakob Hoydis. "Deep reinforcement learning autoencoder with noisy feedback." 2019 International Symposium on Modeling and Optimization in Mobile, Ad Hoc, and Wireless Networks (WiOPT). IEEE, 2019. (Year: 2019).*

(Continued)

*Primary Examiner* — Michael J Huntley
*Assistant Examiner* — Sehwan Kim
(74) *Attorney, Agent, or Firm* — Carr & Ferrell LLP

(57) ABSTRACT

Systems and methods for artificial intelligence discovered codes are described herein. A method includes obtaining received samples from a receive decoder, obtaining decoded bits from the receive decoder based on the receiver samples, training an encoder neural network of a transmit encoder, the encoder neural network receiving parameters that comprise the information bits, the received samples, and the decoded bits. The encoder neural network is optimized using a loss function applied to the decoded bits and the information bits to calculate a forward error correcting code.

19 Claims, 13 Drawing Sheets

(56) References Cited

U.S. PATENT DOCUMENTS

| | | |
|---|---|---|
| 2006/0047862 A1 | 3/2006 | Shearer et al. |
| 2006/0268996 A1 | 11/2006 | Sethi et al. |
| 2009/0086711 A1 | 4/2009 | Capretta et al. |
| 2011/0206019 A1 | 8/2011 | Zhai et al. |
| 2011/0216787 A1 | 9/2011 | Ai et al. |
| 2014/0241309 A1 | 8/2014 | Hilton et al. |
| 2016/0006842 A1 | 1/2016 | Tahir |
| 2017/0269876 A1 | 9/2017 | Mukhopadhyay et al. |
| 2018/0013808 A1 | 1/2018 | Petry et al. |
| 2018/0101957 A1* | 4/2018 | Talathi .................. G06T 7/10 |
| 2018/0267850 A1 | 9/2018 | Froelich et al. |
| 2018/0314985 A1 | 11/2018 | O'Shea |
| 2019/0037052 A1 | 1/2019 | Deshpande |
| 2019/0097914 A1 | 3/2019 | Zhong et al. |
| 2019/0392266 A1 | 12/2019 | Zhong et al. |
| 2019/0393903 A1 | 12/2019 | Mandt et al. |
| 2020/0128279 A1* | 4/2020 | Han ................ H04N 21/4728 |
| 2020/0177418 A1* | 6/2020 | Hoydis ............ H04L 25/03834 |
| 2020/0320371 A1 | 10/2020 | Baker |
| 2020/0383169 A1 | 12/2020 | Takahashi et al. |
| 2021/0014939 A1 | 1/2021 | Verzun et al. |
| 2021/0034846 A1* | 2/2021 | Ko ......................... G06N 3/082 |
| 2021/0056058 A1 | 2/2021 | Lee et al. |
| 2021/0319286 A1* | 10/2021 | Gunduz ................ G06N 3/088 |
| 2022/0209896 A1 | 6/2022 | Gopalan et al. |

OTHER PUBLICATIONS

H. Kim, Y. Jiang, S. Kannan, S. Oh, and P. Viswanath, "Deepcode: Feedback codes via deep learning," in Advances in Neural Information Processing Systems, 2018, pp. 9436-9446. (Year: 2018).*

Yamamoto, Hirosuke, and Shintaro Hara. "Application of Yamamoto-Itoh coding scheme to discrete memoryless broadcast channels." 2017 IEEE International Symposium on Information Theory (ISIT). IEEE, 2017. (Year: 2017).*

Aoudia, Fayçal Ait, and Jakob Hoydis. "End-to-end learning of communications systems without a channel model." 2018 52nd Asilomar Conference on Signals, Systems, and Computers. IEEE, 2018. (Year: 2018).*

Duman, Tolga M., and Masoud Salehi. "On optimal power allocation for turbo codes." Proceedings of IEEE International Symposium on Information Theory. IEEE, 1997. (Year: 1997).*

Arvinte, Marius, Ahmed H. Tewfik, and Sriram Vishwanath. "Deep log-likelihood ratio quantization." 2019 27th European Signal Processing Conference (EUSIPCO). IEEE, 2019. (Year: 2019).*

Sadeghi, Pouriya. Multi-channel processing of turbo codes. Diss. Concordia University, 2003. (Year: 2003).*

Kim et al., "Deepcode: Feedback Codes via Deep Learning," [online] Jul. 2, 2018 [retrieved on Apr. 17, 2020], Retrieved from the Internet: < URL:https://arxiv.org/abs/1807.00801v1>, 24 pages.

"International Search Report" and "Written Opinion", Patent Cooperation Treaty Application No. PCT/US2021/054265, dated Nov. 24, 2021, 24 pages.

\* cited by examiner

SYSTEMS AND METHODS FOR ARTIFICIAL INTELLIGENCE DISCOVERED CODES

CROSS-REFERENCE TO RELATED APPLICATIONS

This application is related to U.S. patent application Ser. No. 17/133,921, titled SYSTEMS AND METHODS FOR UTILIZING DYNAMIC CODES WITH NEURAL NETWORKS, filed on Dec. 24, 2020, which is hereby incorporated by reference herein in its entirety, including all references and appendices cited therein, for all purposes.

FIELD OF THE PRESENT TECHNOLOGY

The present disclosure pertains to the technical field of telecommunications, and more particularly, but not by way of limitation, to systems and methods that utilize artificial intelligence/machine learning, such as neural networks, to discover and optimize error correcting codes for improved wired and wireless transmission.

SUMMARY

The present disclosure can include a method comprising obtaining received samples from a receive decoder, obtaining decoded bits from the receive decoder based on the receiver samples, and training an encoder neural network of a transmit encoder, the encoder neural network receiving parameters that comprise information bits that are to be encoded, the received samples, and the decoded bits. The encoder neural network is optimized using a loss function applied to the decoded bits and the information bits to calculate a forward error correcting code.

The present disclosure can include a system comprising: a transmit encoder comprising: a processor; and a memory for storing instructions, the processor executing the instructions stored in memory to: train an encoder neural network with parameters that comprise information bits, received samples, and decoded bits, wherein the encoder neural network is optimized using a loss function applied to the decoded bits and the information bits to calculate a forward error correcting code; generate encoded information bits using the forward error correcting code; and transmit the encoded information bits to the receive decoder.

The system can also include a receive decoder comprising: a processor; and a memory for storing instructions, the processor executing the instructions stored in memory to train a decoder neural network of the receive decoder using the information bits, receiver output of the receiver, decoder log-likelihood ratio data, and the decoded bits, wherein the decoder neural network optimizes a loss function applied to the decoded bits and the information bits.

The present disclosure can include a method comprising training an encoder neural network of a transmit encoder, the encoder neural network receiving parameters that comprise information bits, received samples, and decoded bits obtained from a receive decoder, wherein the encoder neural network is optimized using a loss function applied to the decoded bits and the information bits to calculate a forward error correcting code; and training a decoder neural network of the receive decoder using the information bits, receiver output of the receive decoder, decoder log-likelihood ratio data, and the decoded bits, wherein the decoder neural network optimizes the loss function applied to the decoded bits and the information bits.

BRIEF DESCRIPTION OF THE DRAWINGS

Certain embodiments of the present technology are illustrated by the accompanying figures. It will be understood that the figures are not necessarily to scale and that details not necessary for an understanding of the technology or that render other details difficult to perceive may be omitted. It will be understood that the technology is not necessarily limited to the particular embodiments illustrated herein.

DETAILED DESCRIPTION

Figure 1:
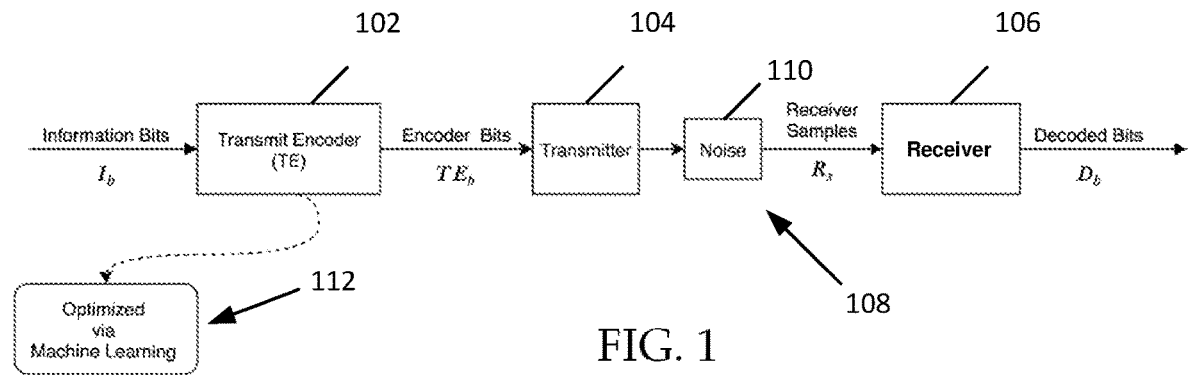
FIG. 1 depicts an illustrative schematic in which techniques and structures for providing the systems and methods disclosed herein may be implemented related to FEC discovery and optimization, and specifically transmit encoder optimization

Generally, the present disclosure pertains to telecommunications, and to systems and methods that discover error-correcting codes using numerical processes such as machine learning. An example error-correcting code includes but is not limited to forward error correcting codes (FEC). Generally, communications systems use forward error-correcting codes (FEC) to rectify errors introduced during wired or wireless transmission (e.g., WiFi, Bluetooth, Cellular, and so forth). The FEC is encoded into information bits and transmitted by a transmitter encoder to a receive decoder. The receive decoder can decode the FEC and perform a Cyclic Redundancy Check (CRC) check on the packet to determine if the packet has been received without errors. When CRC fails on a packet the transmitter encoder is asked to retransmit the failed packet.

To be sure, FEC generation and CRC can be designed using analytical methods. These static polynomial equations are laborious to create, and when constraints are applied to the calculation of FECs, the variables required to represent these constraints in a mathematical or equational form become so voluminous they can become impossible to calculate by a human designer. Stated otherwise, FEC construction can be complex and with increasing complexity comes attendant increases in computing resources required to implement the FEC. Example constraints can include input power, encoding rate, compute power limitations, bandwidth, channel frequency, fading conditions and so forth. The constraints can be imposed by the inherent attributes of the transmit encoder, the communications link used by the transmit encoder, or the inherent attributes of the receive decoder—just to name a few. Moreover, FEC based systems can only be designed analytically for simplified channel models. Designing them for realistic models that include the effects of all the parameters becomes intractable.

Additionally, in situations where small block lengths are utilized (such as in IoT "Internet-of-Things" applications), traditional FECs are not energy efficient (as it is far from Shannon limit). Further, FEC and CRC are not designed jointly and are not used jointly. When a transmitter encoder re-transmits a packet, it has no knowledge of the failed CRC value and no knowledge of the failed packet that was received by the receive decoder.

Generally, the systems and methods herein include the use of neural networks within encoders and/or decoders to discover non-linear FEC and/or control existing FECs. The systems and methods herein can also utilize feedback (such as a failed CRC value, failed packet) to create more energy efficient FECs. Machine Learning (ML) can be used as an effective tool for discovering FEC that utilize feedback. Additionally, ML can be used to optimize the component FEC rates and optimize the number of feedback iterations used in generating FECs.

In sum, while traditional methods for determining FEC and CRC rely on mathematical calculations using formulae that must be derived, the systems and methods herein are configured to implement neural networks or other similar ML/AI (Artificial Intelligence) constructs to numerically discover optimal FEC for data transmission and CRC for error checking.

Turning now to the drawings, FIG. 1 depicts an illustrative schematic in which techniques and structures for providing the systems and methods disclosed herein may be implemented related to FEC discovery and optimization, and specifically transmit encoder optimization. In more detail, the schematic diagram of FIG. 1 includes a transmit encoder 102, a transmitter 104, and a receiver 106. Generally, the transmit encoder 102 can communicate with the receiver 106 over a communications link 108. That is, known patterns of information bits are processed by transmit encoder 102, and are then transmitted wirelessly over the air (or by wire) and received by the receiver 106. The communications link 108 may introduce aspects of noise 110, for example white noise, colored noise, shot noise, and/or phase noise—just to name a few. Information bits $I_b$ are input into the transmit encoder 102. The transmit encoder 102 encodes a FEC code into the information bits $I_b$ to generate encoded bits $TE_b$. It will be understood that in this example, the receiver 106 can be a known device with understood operating parameters.

The encoder bits $TE_b$ are transmitted on the communications link 108 to the receiver 106. Received samples $R_s$ are used by the receiver 106 to generate decoded bits $D_b$. The decoded bits $D_b$ can be compared against the information bits $I_b$. When errors are present in the decoded bits $D_b$ compared with the information bits $I_b$, the receiver 106 may request the transmit encoder 102 to resend the encoded bits $TE_b$. In some embodiments, loss functions can be used to determine errors in the decoded bits $D_b$ compared with the information bits $I_b$. For example, a loss function, such as Hamming distance can be used to determine how many errors are present. The more errors determined, the larger the Hamming distance, and vice-versa. While Hamming distance is disclosed, other methods of loss calculation such as quadratic loss can also be used. An example equation for determining Hamming distance is: $d_{Hamming}(D_b, I_b)$. An example equation for determining quadratic loss is:

$$\sum_b (D_b - I_b)^2.$$

As noted above, various constraints can be included in the optimization of the transmit encoder 102. Example constraints can include input power: $E(TE_b^2)=1$ or encoding rate: $Rate(TE_b/I_b)$.

Figure 2:
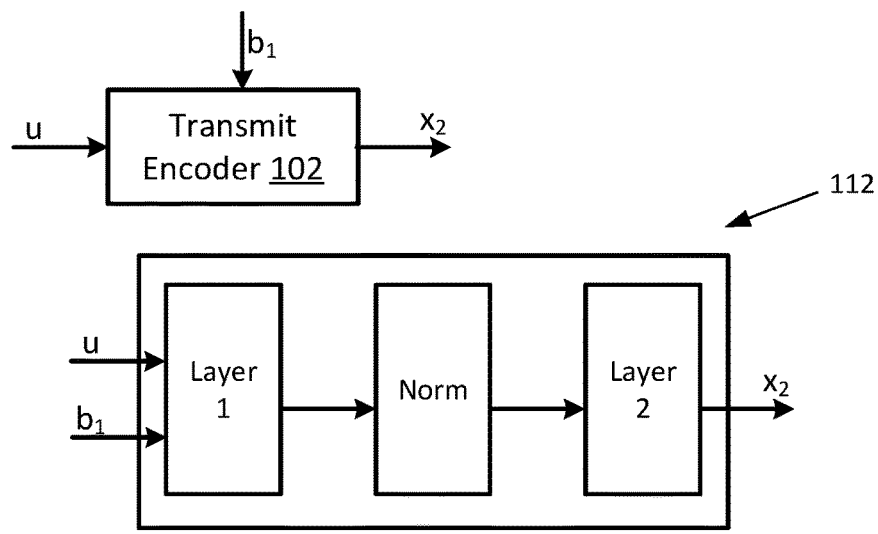
FIG. 2 illustrates an example schematic representation of a fully connected neural network.
Figure 2:
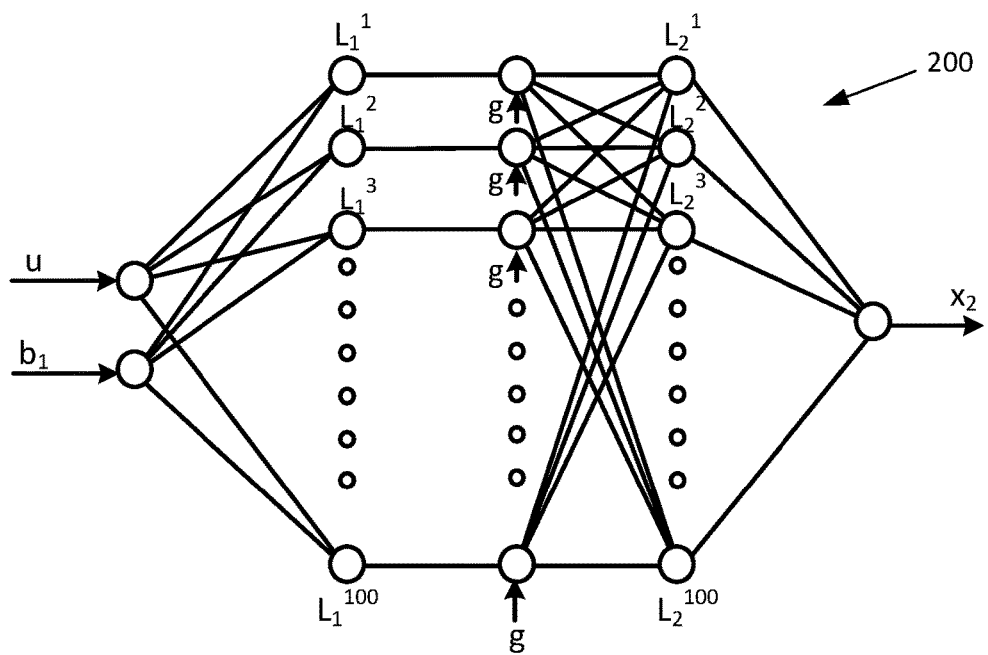

The transmit encoder 102 implements an encoder neural network 112 that can be trained using parameters that include, but are not limited to, the information bits Ib, the encoded bits $TE_b$, the received samples $R_s$, and the decoded bits $D_b$. An example neural network construct 200 (also referred to herein as neural network 200) is illustrated in FIG. 2. The neural network construct 200 is a fully connected neural network. In general, the neural network construct 200 receives as input both variables U and bits $B_1$. These variables and bits are passed into a layer, such as Layer 1. Each connection in a layer can be dynamically weighted. The weighting of each connection in a layer can be optimized over time via gradient descent, as an example. While two layers are illustrated, the neural network construct 200 can comprise any number of layers. It will be understood that the neural network can also be implemented as a recurrent neural network which includes internal state information.

Also, the transmit encoder 102 can implement a normalization function Norm between Layer 1 and Layer 2, as an example. The neural network construct 200 is comprised of a plurality of connections, such as nodes that are associated with a layer. For example, nodes $[L_1^1, L_1^2, L_1^3 L_1^{100}]$ belong to Layer 1. Each connected node is provided with a weight. The neural network 200 iterates over the weights of the nodes. As the weighting of the nodes change, the resulting FEC produced by the neural network 200 changes.

Advantageously, because the FEC codes can be optimized in real-time, error can also be monitored in real-time, as packet transmission/reception occur. The systems disclosed herein can be continually optimized due to error variation or a change in constraints. For example, if electrical or electromagnetic radiation causes a change in the noise in a communications link, these changes cause additional or different error in encoded data transmission. The systems disclosed herein can be configured to correct for these changes in real-time using the neural network-based processes disclosed herein. Also, in another advantage, the error values determined over time can be stored and analyzed for optimization of wireless networks, and/or individual communications links.

The parameters/variables that are processed by the neural network construct 200 can include any of the information bits $I_b$, the encoded bits $TE_b$, the received samples $R_s$, and the decoded bits $D_b$. Using a loss function and one or more constraints, the weights assigned to each of the variables can be adjusted over time to improve the FEC generated by the neural network 200. For example, after variables are initiated with weighting, the resulting FEC can be optimized by adjustment of the variable weighting and subsequent calculation of loss function, such as Hamming distance noted above. The training of the neural network construct 200 results in a shrinking of the Hamming distance, to converge at an error rate that is close to, or actually zero. To be sure, the neural network construct 200 iterates over the network weights noted above, attempting to converge at the smallest possible error rate. Also, it will be understood that some variable values and weights change over time. For example, received samples $R_s$, and the decoded bits $D_b$ may vary based on change in noise 110 or other factors. Again, the outcome is to produce an optimized FEC, illustrated as $X_2$. While an example neural network has been illustrated, other constructs such as a Long Short Term Memory (LTSM) network construct can also be utilized in accordance with the present disclosure.

Figure 3:
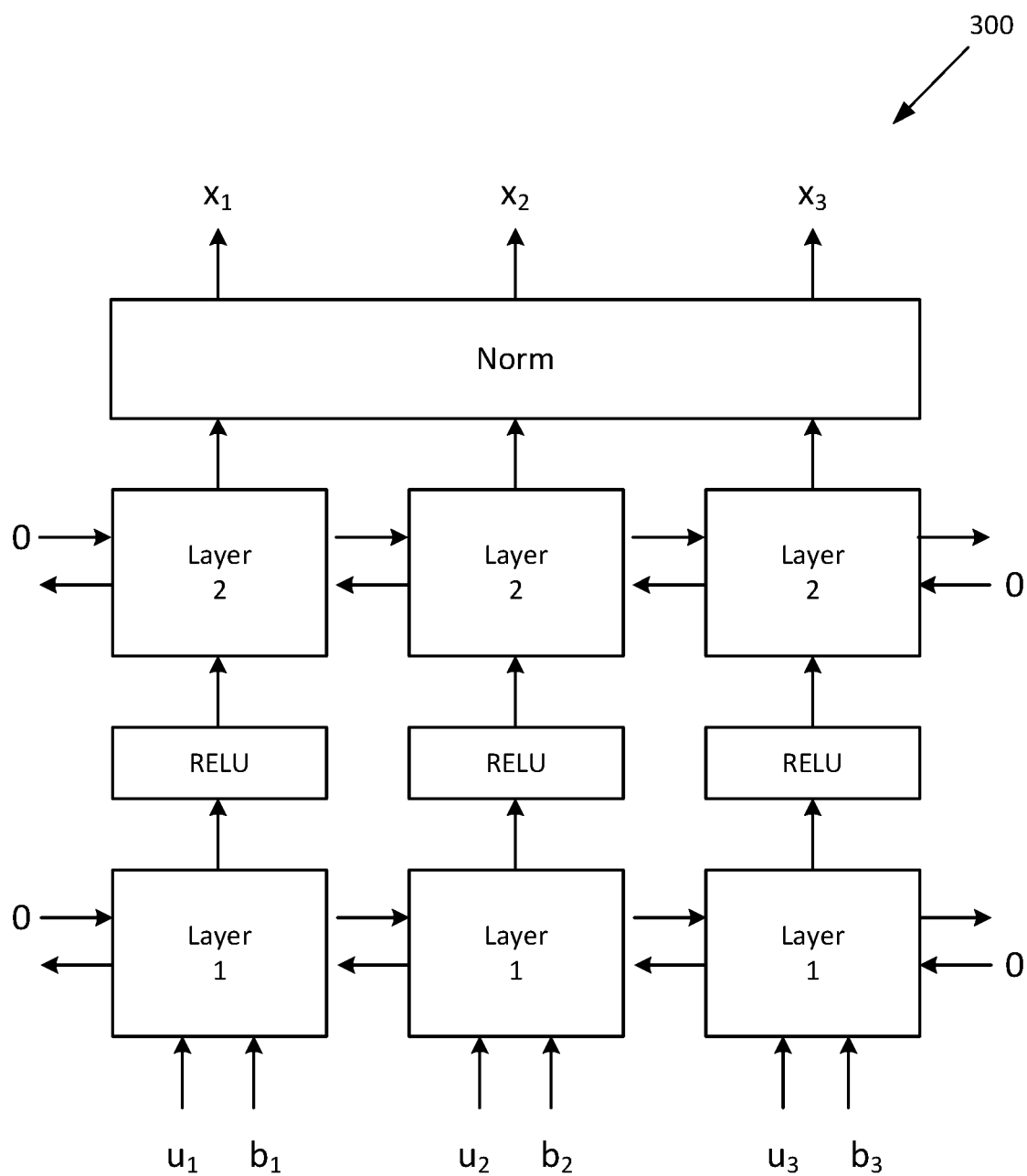
FIG. 3 illustrates an example schematic representation of a recursive neural network that can be used in place of the fully connected neural network.

FIG. 3 illustrates an example schematic representation of a neural network construct 300 (also referred to herein as neural network 300) that can be used in place of the neural network construct 200 of FIG. 2. The neural network construct 300 is a recursive neural network. The neural network 300 is comprised of various layers, such as Layer 1 and Layer 2 blocks. The Layer 1 blocks receive variables $U_1$ and bits $B_1$. Variables and bits processed by the Layer 1 blocks are fed into rectified linear unit "RELU" blocks. The output of the RELU blocks is fed into Layer 2 blocks for further processing. To be sure, the neural network 300 can include any number of layer blocks and RELU blocks, with the output of the final set of Layer blocks feeding into a normalization "Norm" function to generate aspects of the FEC $[X_1, X_2, X_3]$.

Figure 4:
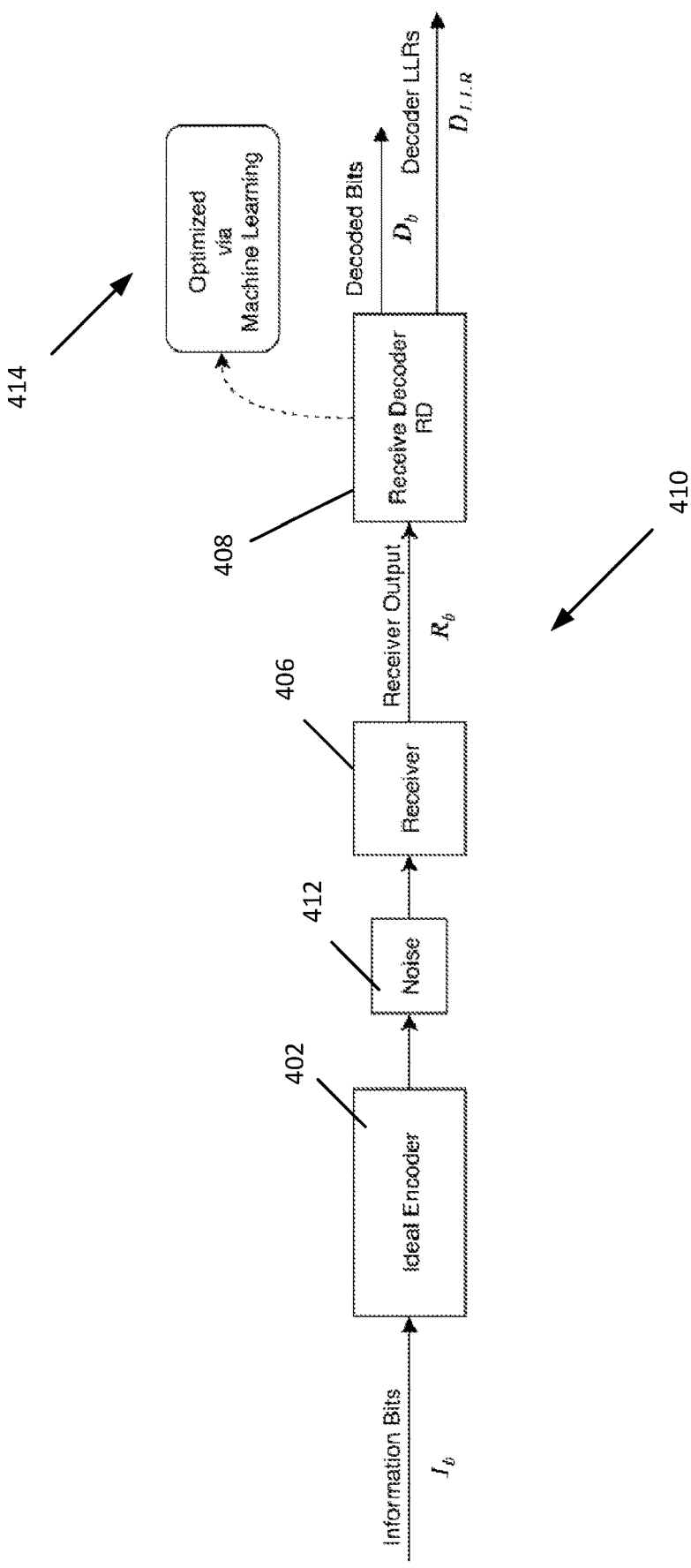
FIG. 4 depicts an illustrative schematic in which techniques and structures for providing the systems and methods disclosed herein may be implemented related to FEC discovery and optimization, and specifically receive decoder optimization.

FIG. 4 depicts an illustrative schematic in which techniques and structures for providing the systems and methods disclosed herein may be implemented related to FEC discovery and optimization, and specifically receive decoder optimization. In more detail, the schematic diagram of FIG. 4 includes a transmit encoder 402, a receiver 406, and a receive decoder 408. Generally, the transmit encoder 402 can communicate with the receiver 406 over a communications link 410. That is, known patterns of information bits are processed by transmit encoder 402, and are then transmitted wirelessly over the air (or by wire) and received by the receiver 406. The communications link 410 may introduce aspects of noise 412. Information bits $I_b$ are input into the transmit encoder 402. The transmit encoder 402 encodes a FEC into the information bits $I_b$ to generate encoded bits $TE_b$.

In contrast with the transmit encoder 402 illustrated in FIG. 1, the transmit encoder 402 is a known device with known operating parameters. The receiver 406 cooperates with the receive decoder 408 that implements a decoder neural network 414 that is configured to process known patterns of information bits $I_b$ which have been transmitted over a communications link using the transmit encoder 402. While illustrated schematically and separately, the decoder neural network 414 can be implemented within the receive decoder 408. The decoder neural network 414 can be trained using training parameters comprising the information bits $I_b$, the receiver output $R_b$ of the receiver 406, the decoded bits Db, and decoder log-likelihood ratio data $D_{LLR}$. One skilled in the art would know that the log-likelihood ratio represents data generated during the receiver decoding process and can be made accessible to software or hardware outside of a receiver. The digital receivers have a way of determining the probability that a particular bit is 1 or 0. The log-likelihood-ratio (LLR) of the bit is defined as: LLR=Log (Probability that a bit is 1) -Log (Probability that a bit is 0).

During the training procedure parameters of the decoder neural network 414 could be optimized based on a combination loss function(s) and under a combination of constraint(s). The loss function(s) can include, but are not limited to, Hamming distance or quadratic loss. Example constraints could include received power $E(R_b^2)=1$ or decoding rate Rate($R_b/D_b$).

The decoder neural network 414 can be constructed using, for example, any of the constructs of FIG. 2 or 3, for implementing a fully connected neural network or a recursive neural network. Again, while these example types of neural networks have been disclosed, other neural networks can also be utilized.

Figure 5:
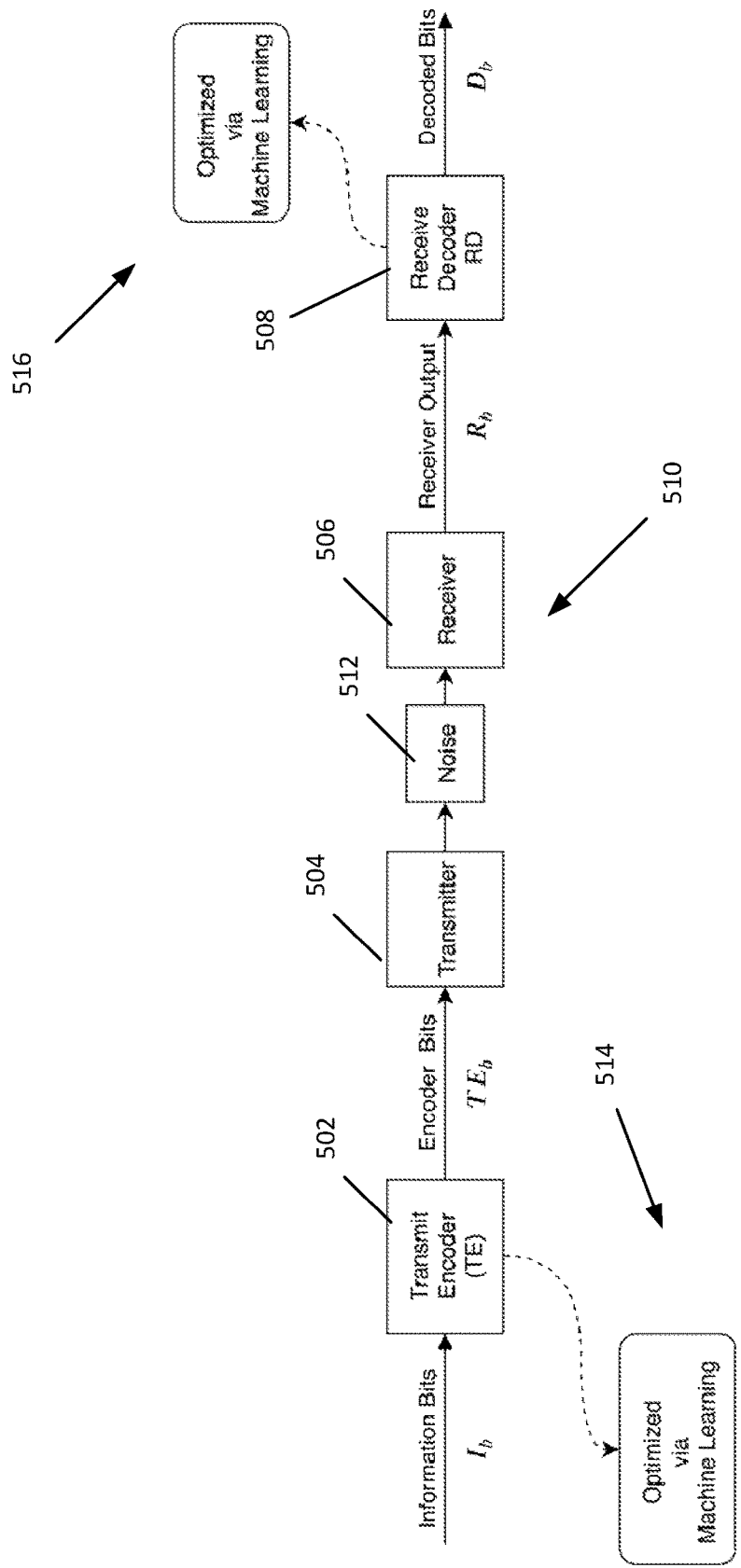
FIG. 5 depicts an illustrative schematic in which techniques and structures for providing the systems and methods disclosed herein may be implemented related to FEC discovery and optimization and specifically joint transmit encoder optimization and receive decoder optimization.

FIG. 5 depicts an illustrative schematic in which techniques and structures for providing the systems and methods disclosed herein may be implemented related to FEC discovery and optimization and specifically joint transmit encoder optimization and receive decoder optimization. In some embodiments, the joint transmit encoder and receive decoder optimization can occur simultaneously. That is, the neural network of the transmit encoder and the neural network of the receive decoder can be trained simultaneously.

The schematic diagram of FIG. 5 includes a transmit encoder 502, a transmitter 504, a receiver 506, and a receive decoder 508. Generally, the transmitter 504 can communicate with the receiver 506 over a communications link 510. Again, the communications link 510 can have one or more aspects of noise 512.

Known patterns of information bits $I_b$ are processed by transmit encoder 502, transmitted wirelessly by the transmitter 504 over the communications link 510 and processed by receive decoder 508. The transmit encoder 502 creates encoded bits $TE_b$ that are transmitted wirelessly by the transmitter 504 over the communications link 510. These encoded bits $TE_b$ are created using an encoder neural network 514. The receiver 506 generates receiver output bits $R_b$ that are provided to the receive decoder 508. The receive decoder 508 processes the receiver output bits $R_b$ using a decoder neural network 516. Again, the structure and operation of the encoder neural network 514 and/or the decoder neural network 516 may substantially correspond to the fully connected neural network illustrated and described with respect to FIG. 2 and/or the recursive neural network illustrated and described with respect to FIG. 3.

During training, parameters of a neural network (either encoder or decoder) could be optimized based on a combination loss function(s) and under one or more constraints. The training of a neural network can be based on a convolution of code, packet size, noise, or other constraints such as processing power limits (of encoder or decoder), packet sizing, memory allocation, and the like. Regardless of the constraints, the neural network can be trained to determine an optimal structure of the encoder or decoder.

Again, the loss functions can include Hamming distance or quadratic loss, while the constraints could include input power and encoding rate for the encoder neural network 514. Constraints could include received power and decoding rate for the decoder neural network 516.

To be sure, the embodiments set forth above describe instances where one-bit feedback is provided back to the transmit encoder. That is, the feedback only indicates if previous transmission was received correctly or not. If the previous transmission was not received correctly (such as when there is a CRC failure) the transmit encoder can be asked by the receiver to re-transmit the previous packet. The transmit encoder 102 may not receive any further data to improve the chances of encoded data being received correctly in a future transmission.

In general, the embodiments of FIGS. 1-5, as noted above, include encoders and/or decoders. These encoders and/or decoders can be constructed with at least a processor and memory that stores instructions. The processor executes the instructions stored in memory to perform the neural network training methods disclosed herein for discovering FEC codes, encoding data, decoding data, as well as generating and using various types of feedback to improve FEC codes discovery.

Figure 6:
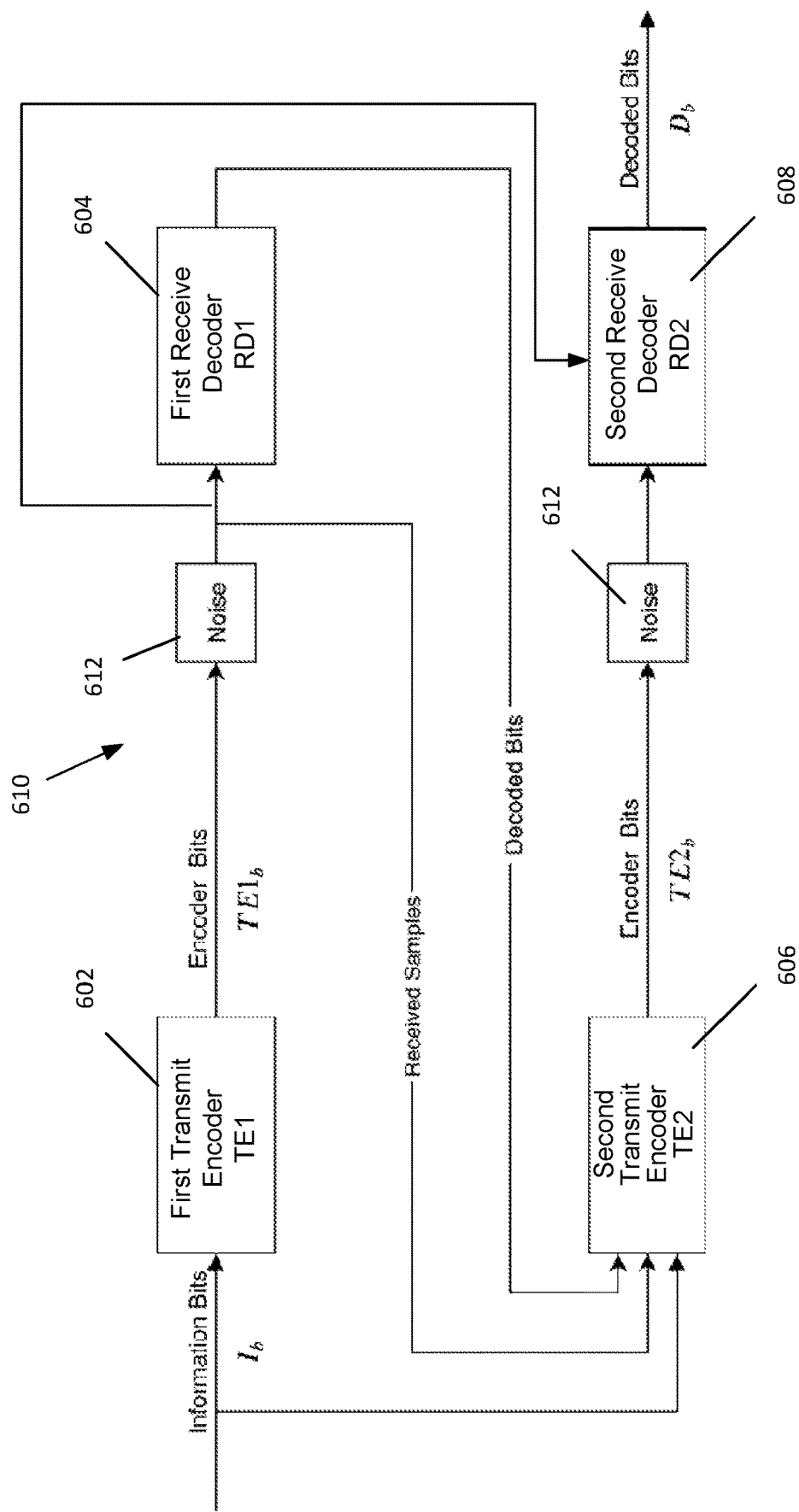
FIG. 6 illustrates another illustrative schematic in which techniques and structures for providing the systems and methods disclosed herein may be implemented related to FEC discovery and optimization.

FIG. 6 illustrates another illustrative schematic in which techniques and structures for providing the systems and methods disclosed herein may be implemented related to FEC discovery and optimization. The schematic of FIG. 6 involves the use of additional feedback for optimizing the FEC generated by a transmit encoder.

The schematic includes a first transmit encoder 602, a first receive decoder 604, a second transmit encoder 606, and a second receive decoder 608. Additional pairs of transmit encoders and receive decoders can be included. The first transmit encoder 602 receives information bits $I_b$ and encodes the information bits $I_b$ to produce encoded bits $TE1_b$. The encoded bits $TE1_b$ are transmitted over a wireless link 610 to the first receive decoder 604. Again, the wireless link 610 may impute one or more aspects of noise 612. Received samples and decoded bits can be fed into the second transmit encoder 606, along with the information bits $I_b$. The second transmit encoder 606 can utilize the received samples, decoded bits, and information bits $I_b$ to improve the FEC used to encode the information bits $I_b$. Further, the second receive decoder can utilize either or both the second transmit information and the first transmit information to decode the information bits Lb.

Generally, a transmit encoder can be configured to utilize any combination of a re-transmit request, decoded bits of a prior decoder that failed the CRC, and received samples used by the first decoder. The transmit encoder can now use the additional information to transmit a message that had a higher chance of being decoded.

Various examples for designing an encoder and/or decoder are provided below in FIGS. 7-12. In detail, these example embodiments describe how a neural network based encoder and/or decoder can be designed to use these additional types of feedback.

Figure 7:
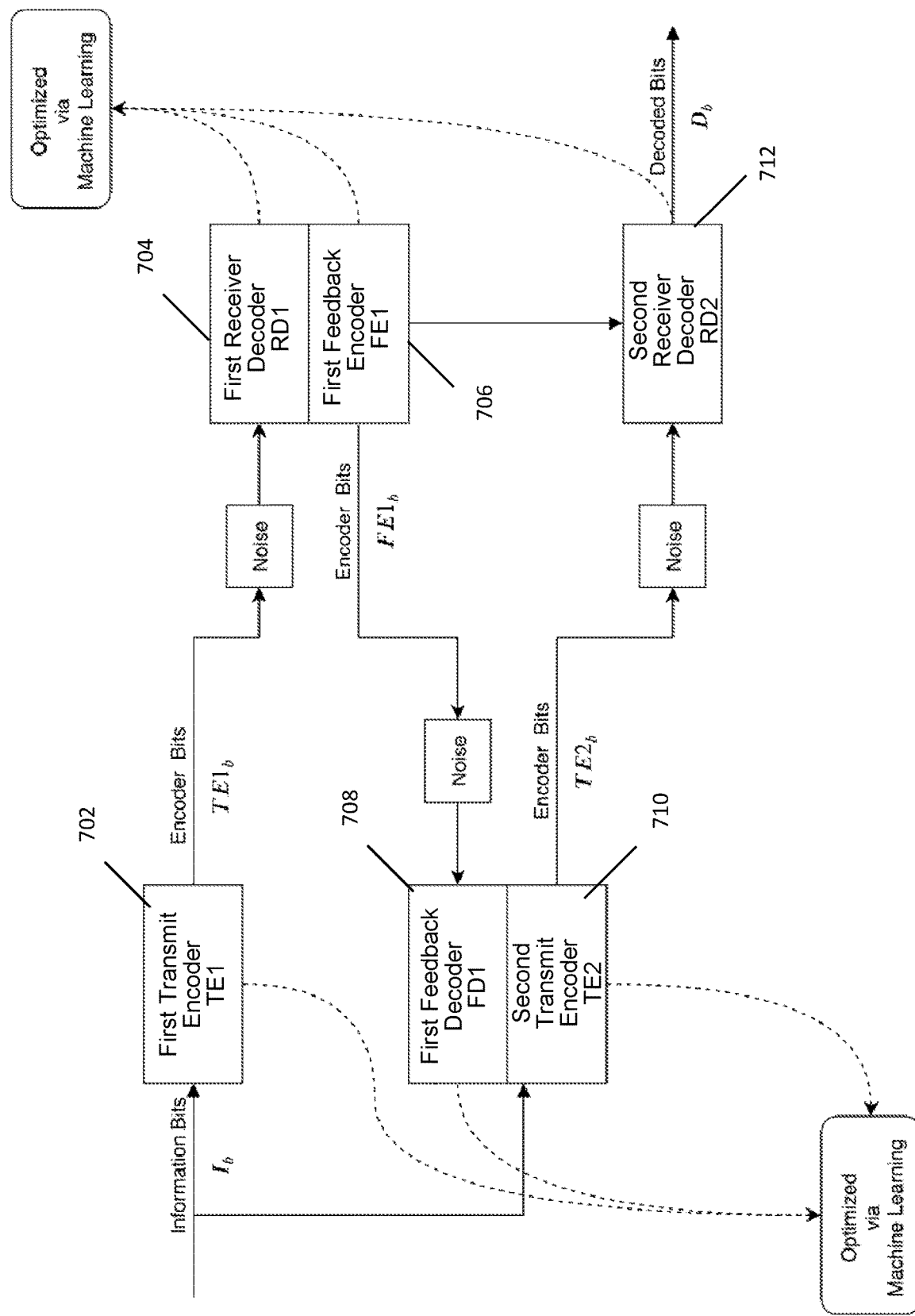
FIG. 7 is a schematic diagram of an example feedback code optimization system

FIG. 7 is a schematic diagram of an example feedback code optimization system that includes a first transmit encoder 702, a first receive decoder 704, a first feedback encoder 706, a first feedback decoder 708, a second transmit encoder 710, and a second receive decoder 712, each of which can be implemented using a neural network as disclosed above. Known patterns of information bits $I_b$ can be processed to using training parameters that include the information bits $I_b$, encoded bits $TE1_b$ of the first transmit encoder 702, receive decoder bits $RD1_b$, feedback encoder bits $FE1_b$, feedback decoder bits $FD1_b$, encoded bits $TE2_b$ of the second transmit encoder 710, and the receive decoder bits $RD2_b$. The system can be optimized using any suitable loss function under one or more constraints such as input power, encoding rate, received power, decoding rate, and so forth. Each transmit encoder also receives the information bits $I_b$ as input.

Figure 8:
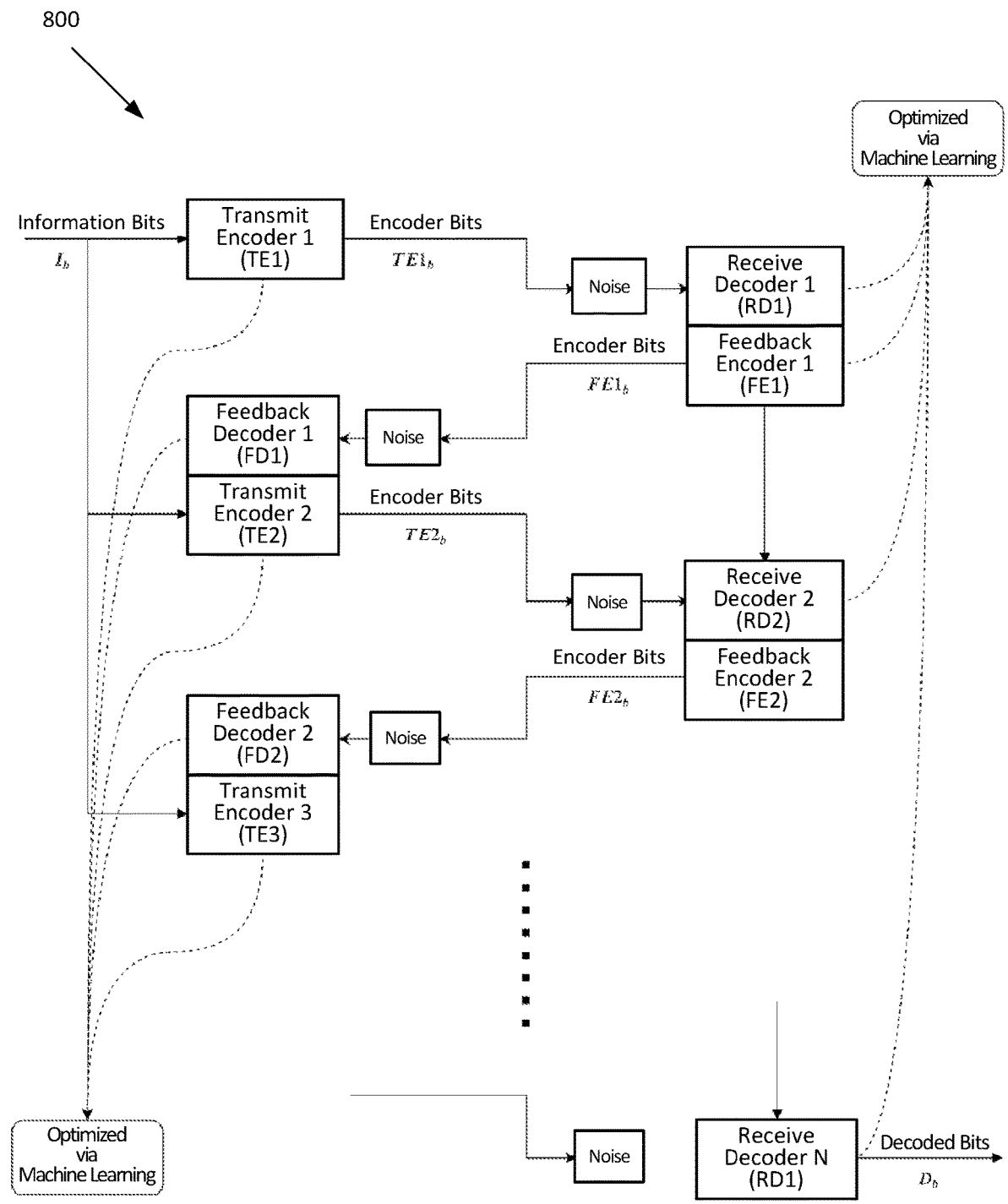
FIG. 8 is a schematic diagram of an example system that utilizes multi-turn feedback codes

FIG. 8 is a schematic diagram of an example system 800 that utilizes multi-turn feedback codes. This system 800 includes each of the components above with respect to FIG. 7, but includes multiple instances of the encoder, decoder, and feedback encoder/decoder elements. Each turn of the system 800 includes a transmit encoder, a receive decoder, a feedback encoder, and a feedback decoder. The feedback decoder provides data to the transmit encoder of the next turn in the system 800.

Figure 9:
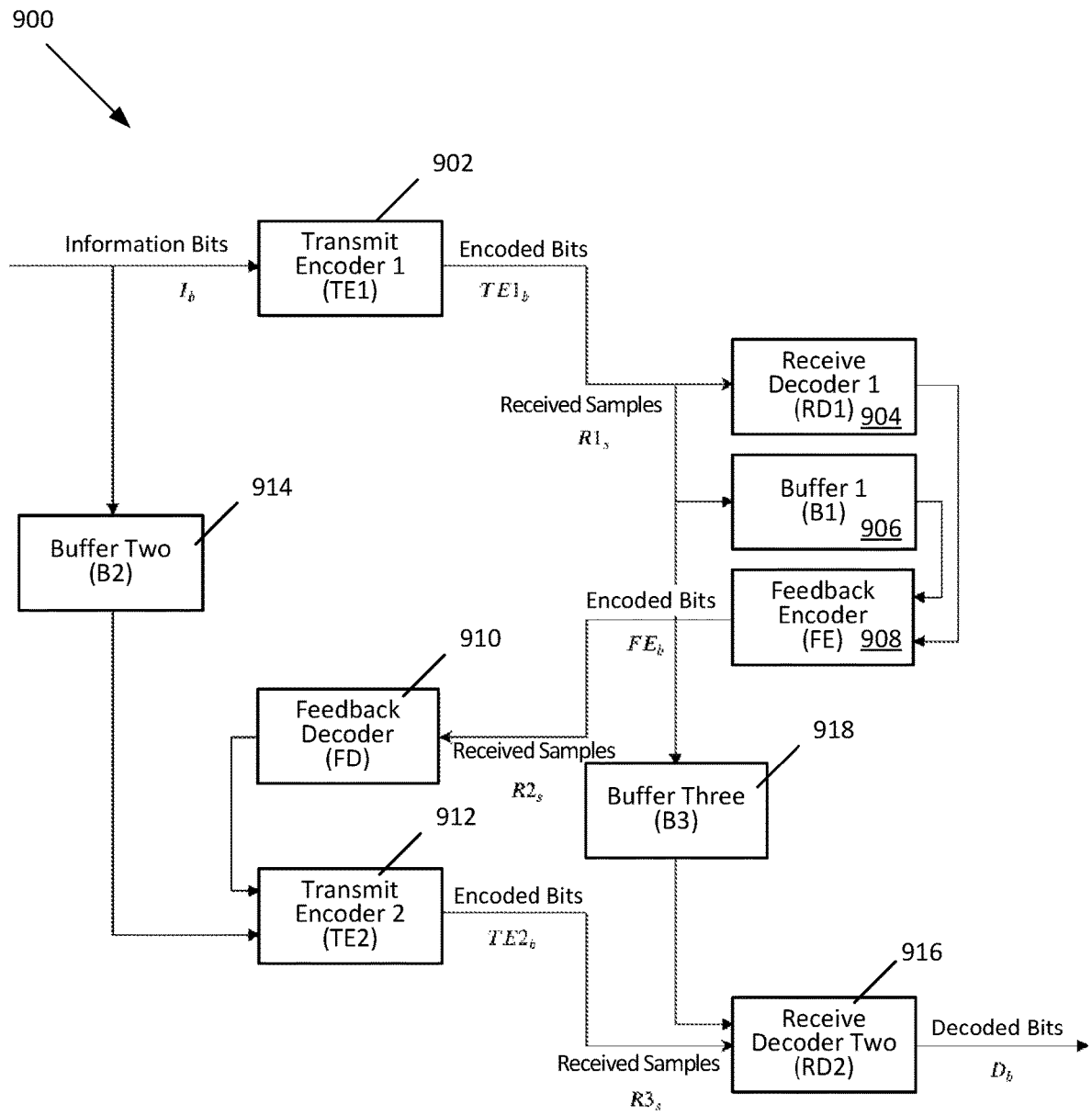
FIG. 9 is a schematic diagram of an example system that utilizes received samples as feedback

FIG. 9 is a schematic diagram of an example system 900 that utilizes received samples as feedback. A transmit encoder 902 generates encoded bits $TE1_b$ that are transmitted to a receive decoder 904. Received samples $R1_s$ are fed into the receive decoder 904, a buffer 906, and a feedback encoder 908. The feedback encoder 908 receives decoded bits from the receive decoder 904 and combines these data with the received samples $R1_s$ from the buffer 906 to generate encoded bits $FE_b$. A feedback decoder 910 transmits the encoded bits $FE_b$ and received samples $R2_s$ to a second transmit encoder 912. Another buffer 914 can provide buffered, information bits $I_b$ to the second transmit encoder 912. The second transmit encoder 912 generates encoded bits $TE2_b$ and received samples $R3_b$ to a second receive decoder 916. The second receive decoder 916 utilizes the encoded bits $TE2_b$ and received samples $R3_b$ to generate decoded bits $D_b$. Some embodiments include a third buffer 918 that can be used to buffer and feed encoded bits to the second receive decoder 916.

Figure 10:
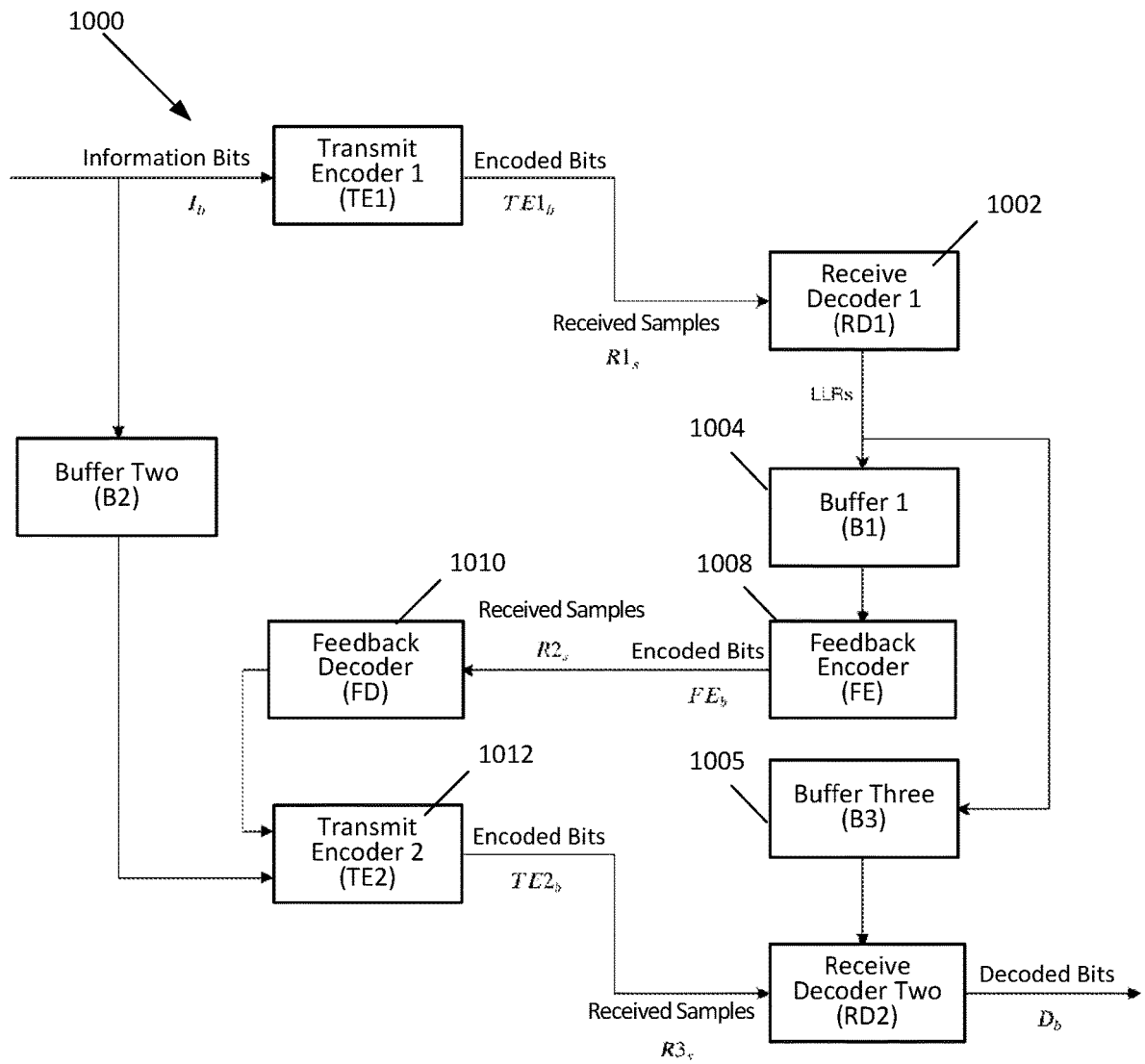
FIG. 10 is a schematic diagram of an example system that utilizes log-likelihood ratio and decoded bits as feedback

FIG. 10 is a schematic diagram of an example system 1000 that utilizes log-likelihood ratio and decoded bits as feedback. A log-likelihood ratio for the first receive decoder 1002 can be transmitted to a buffer 1004 and forwarded to a feedback encoder 1006 and a downstream buffer 1005. Decoded bits from the first receive decoder 1002 can be combined with the log-likelihood ratio and encoded as feedback by feedback encoder 1008. A feedback decoder 1010 can decode received samples $R2s$, along with encoded bits $FE_b$ that include the log-likelihood ratio and decoded bits. These data are fed into a second transmit encoder 1012.

Figure 11:
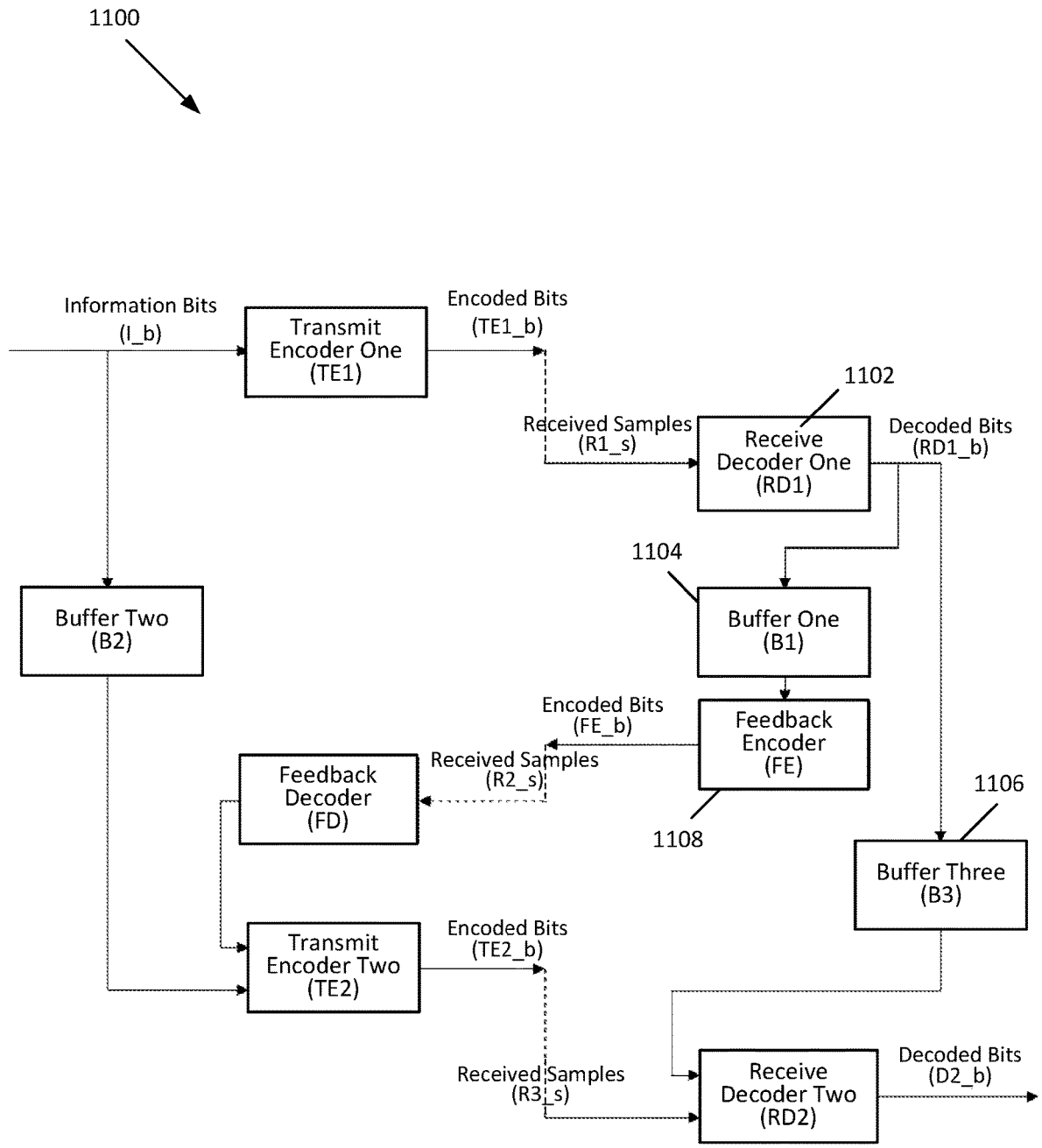
FIG. 11 is a schematic diagram of an example system that utilizes decoded bits as feedback

FIG. 11 is a schematic diagram of an example system 1100 that utilizes decoded bits as feedback. For example, a receive decoder 1102 creates decoded bits $RD1_b$ that are provided to a buffer 1104 and another downstream buffer 1106. The decoded bits are encoded by a feedback encoder 1108 into encoded bits $FE_b$. The feedback encoder 1108 transmits received samples $R2_s$ and encoded bits $FE_b$. A transmit encoder uses the decoded bits obtained from the encoded bits $FE_b$ and received samples $R2_s$ to improve how encoded bits $TE2_b$ are produced.

Figure 12:
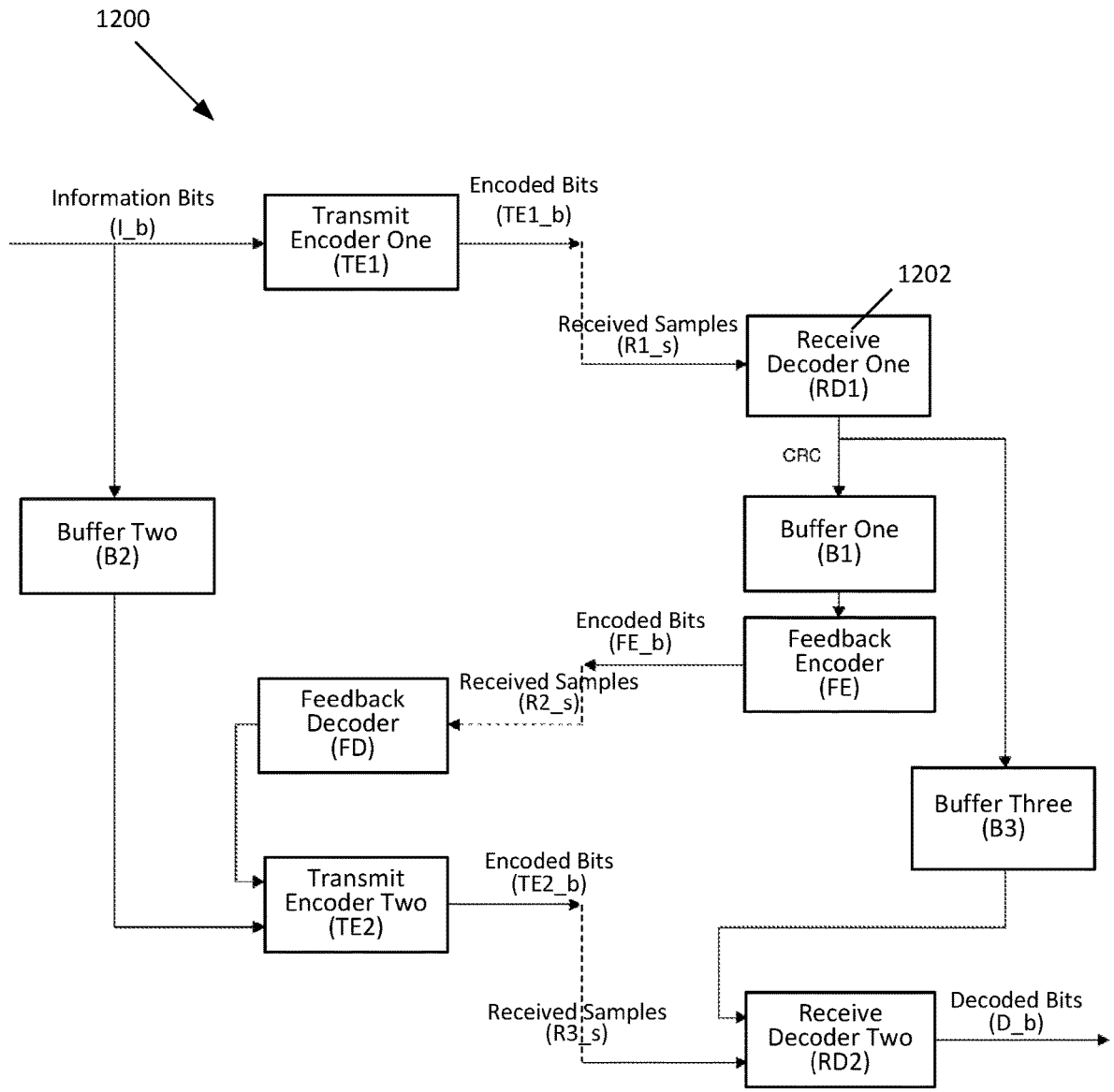
FIG. 12 is a schematic diagram of an example system that utilizes a cyclic redundancy check of the decoded bits as feedback

FIG. 12 is a schematic diagram of an example system 1200 that utilizes a cyclic redundancy check of the decoded bits as feedback. To be sure, this embodiment reduces the size of memory required to implement the system of FIG. 9. The system 1200 uses the decoded CRC produced by a receive decoder 1202 instead of the received samples to generate feedback and to aid in decoding.

Figure 13:
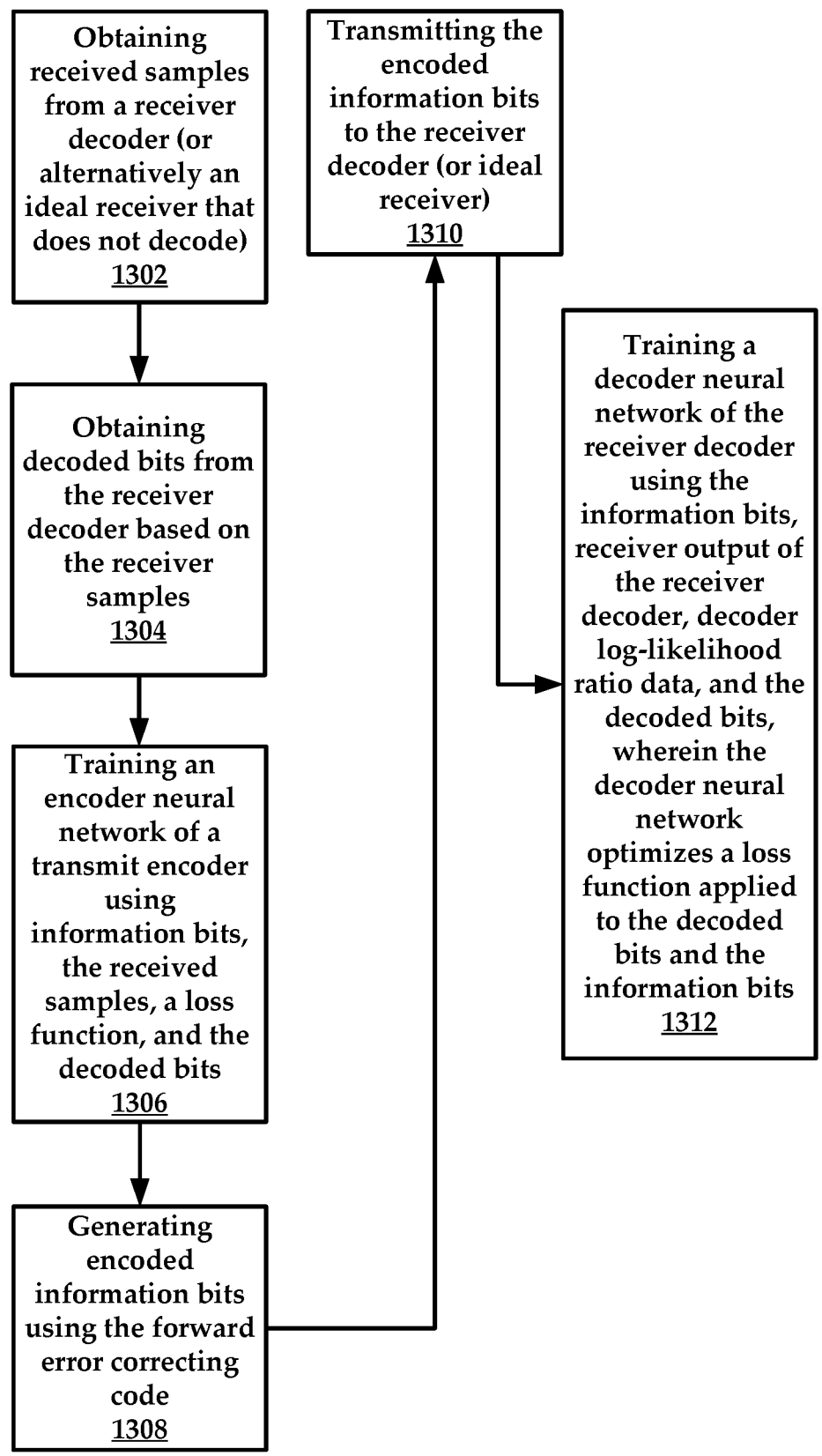
FIG. 13 is a flowchart of an example method of the present disclosure.

FIG. 13 is a flowchart of an example method of the present disclosure. The method involves the optimization of a transmit encoder that implements a neural network. The method includes a step 1302 of obtaining received samples from a receive decoder (or alternatively an ideal receiver that does not decode). The method can include a step 1304 of obtaining decoded bits from the receive decoder based on the receiver samples. The method can include a step 1306 of training an encoder neural network of a transmit encoder. The encoder neural network receives parameters that comprise the information bits, the received samples, a loss function, and the decoded bits. In some embodiments, the encoder neural network is optimized using a loss function applied to the decoded bits and the information bits to calculate a forward error correcting code. For example, at each iteration, a Hamming distance is calculated to determine an error rate that compares the decoded bits to the information bits that were decoded from encoded bits. At each iteration, weighting and variables in the encoder neural network are adjusted and subsequent error rates are obtained to determine if the Hamming distance is being reduced. When the Hamming distance is reduced to at or below a threshold error rate, the forward error correcting code is considered to be optimized. The threshold error rate could be as low as zero, or any other desired value. Also, as noted above, the error rate can be affected and also optimized relative to one or more constraints that are related to the transmit encoder such as encoding rate, input power, compute power, bandwidth, latency, limitations on overall power consumption, block length constraints, and so forth.

In some embodiments, the method can include a step 1308 of generating encoded information bits using the forward error correcting code, as well as a step 1310 of transmitting the encoded information bits to the receive decoder (or ideal receiver).

In one or more embodiments, the method can include a step 1312 of training a decoder neural network of the receive decoder using the information bits, receiver output of the receive decoder, decoder log-likelihood ratio data, and the decoded bits, wherein the decoder neural network optimizes a loss function applied to the decoded bits and the information bits.

In some instances, the encoder neural network and the decoder neural network can be trained simultaneously, allowing the encoder neural network to discover optimized FEC and the decoder neural network to efficiently decode encoded bits that have been encoded with the optimized FEC. In some embodiments, the training of the decoder neural network includes applying a decoder constraint of the receive decoder. The decoder constraint comprises any of received power or decoding rate, as examples.

The neural networks disclosed herein can be improved by use of feedback that includes, as noted above, either one-bit feedback or higher order feedback such as a portion of the decoded bits that failed a cyclic redundancy check, and the received samples.

In some embodiments, a second transmit encoder may be present. The method can include transmitting the feedback to a second transmit encoder that implements a second encoder neural network. The second encoder neural network generates an updated forward error correcting code that is used to encode the information bits, the second transmit encoder transmitting information bits encoded with the updated forward error correcting code to a second receive decoder.

In various embodiments, feedback can be encoded by a feedback encoder, prior to transmitting the feedback to the second transmit encoder. The feedback can include decoder log-likelihood ratio data of the decoded bits, the decoded bits, and/or CRC data.

Figure 14:
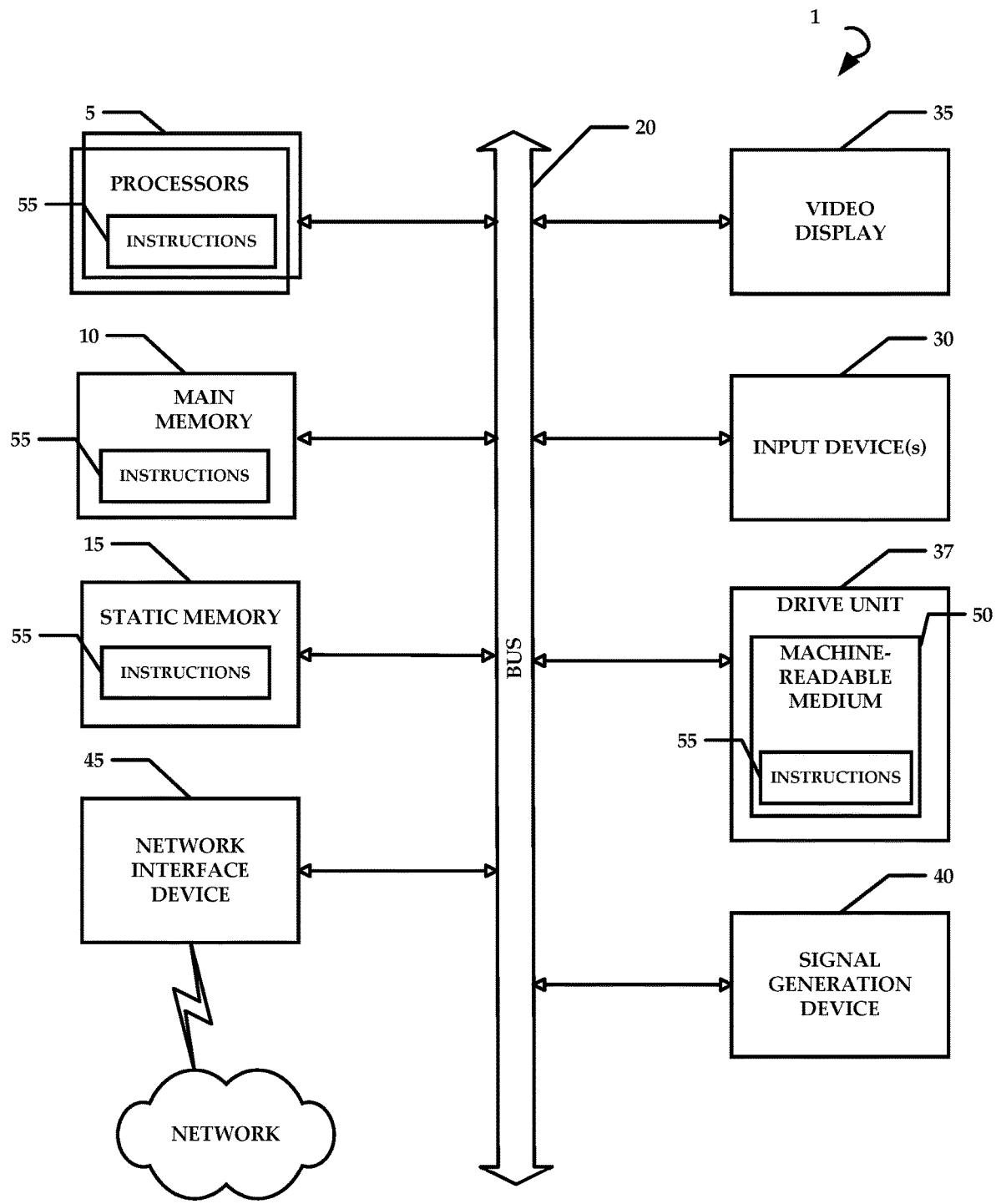
FIG. 14 is a schematic diagram of an exemplary computer system that is used to implement embodiments according to the present technology.

FIG. 14 is a diagrammatic representation of an example machine in the form of a computer system 1, within which a set of instructions for causing the machine to perform any one or more of the methodologies discussed herein may be executed. In various example embodiments, the machine operates as a standalone device or may be connected (e.g., networked) to other machines. In a networked deployment, the machine may operate in the capacity of a server or a client machine in a server-client network environment, or as a peer machine in a peer-to-peer (or distributed) network environment. The machine may be a personal computer (PC), a tablet PC, a set-top box (STB), a personal digital assistant (PDA), a cellular telephone, a portable music player (e.g., a portable hard drive audio device such as a Moving Picture Experts Group Audio Layer 3 (MP3) player), a web appliance, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The computer system 1 includes a processor or multiple processor(s) 5 (e.g., a central processing unit (CPU), a graphics processing unit (GPU), or both), and a main memory 10 and static memory 15, which communicate with each other via a bus 20. The computer system 1 may further include a video display 35 (e.g., a liquid crystal display (LCD)). The computer system 1 may also include an alpha-numeric input device(s) 30 (e.g., a keyboard), a cursor control device (e.g., a mouse), a voice recognition or biometric verification unit (not shown), a drive unit 37 (also referred to as disk drive unit), a signal generation device 40 (e.g., a speaker), and a network interface device 45. The computer system 1 may further include a data encryption module (not shown) to encrypt data.

The drive unit 37 includes a computer or machine-readable medium 50 on which is stored one or more sets of instructions and data structures (e.g., instructions 55) embodying or utilizing any one or more of the methodologies or functions described herein. The instructions 55 may also reside, completely or at least partially, within the main memory 10 and/or within the processor(s) 5 during execution thereof by the computer system 1. The main memory 10 and the processor(s) 5 may also constitute machine-readable media.

The instructions 55 may further be transmitted or received over a network via the network interface device 45 utilizing any one of a number of well-known transfer protocols (e.g., Hyper Text Transfer Protocol (HTTP)). While the machine-readable medium 50 is shown in an example embodiment to be a single medium, the term "computer-readable medium" should be taken to include a single medium or multiple media (e.g., a centralized or distributed database and/or associated caches and servers) that store the one or more sets of instructions. The term "computer-readable medium" shall also be taken to include any medium that is capable of storing, encoding, or carrying a set of instructions for execution by the machine and that causes the machine to perform any one or more of the methodologies of the present application, or that is capable of storing, encoding, or carrying data structures utilized by or associated with such a set of instructions. The term "computer-readable medium" shall accordingly be taken to include, but not be limited to, solid-state memories, optical and magnetic media, and carrier wave signals. Such media may also include, without limitation, hard disks, floppy disks, flash memory cards, digital video disks, random access memory (RAM), read only memory (ROM), and the like. The example embodiments described herein may be implemented in an operating environment comprising software installed on a computer, in hardware, or in a combination of software and hardware.

The components provided in the computer system 1 of FIG. 10 are those typically found in computer systems that may be suitable for use with embodiments of the present disclosure and are intended to represent a broad category of such computer components that are well known in the art. Thus, the computer system 1 of FIG. 10 can be a personal computer (PC), hand held computer system, telephone, mobile computer system, workstation, tablet, phablet, mobile phone, server, minicomputer, mainframe computer, wearable, or any other computer system. The computer may also include different bus configurations, networked platforms, multi-processor platforms, and the like. Various operating systems may be used including UNIX, LINUX, WINDOWS, MAC OS, PALM OS, QNX ANDROID, IOS, CHROME, TIZEN, and other suitable operating systems.

Some of the above-described functions may be composed of instructions that are stored on storage media (e.g., computer-readable medium). The instructions may be retrieved and executed by the processor. Some examples of storage media are memory devices, tapes, disks, and the like. The instructions are operational when executed by the processor to direct the processor to operate in accord with the technology. Those skilled in the art are familiar with instructions, processor(s), and storage media.

In some embodiments, the computer system 1 may be implemented as a cloud-based computing environment, such as a virtual machine operating within a computing cloud. In other embodiments, the computer system 1 may itself include a cloud-based computing environment, where the functionalities of the computer system 1 are executed in a distributed fashion. Thus, the computer system 1, when configured as a computing cloud, may include pluralities of computing devices in various forms, as will be described in greater detail below.

In general, a cloud-based computing environment is a resource that typically combines the computational power of a large grouping of processors (such as within web servers) and/or that combines the storage capacity of a large grouping of computer memories or storage devices. Systems that provide cloud-based resources may be utilized exclusively by their owners or such systems may be accessible to outside users who deploy applications within the computing infrastructure to obtain the benefit of large computational or storage resources.

The cloud is formed, for example, by a network of web servers that comprise a plurality of computing devices, such as the computer system 1, with each server (or at least a plurality thereof) providing processor and/or storage resources. These servers manage workloads provided by multiple users (e.g., cloud resource customers or other users). Typically, each user places workload demands upon the cloud that vary in real-time, sometimes dramatically. The nature and extent of these variations typically depends on the type of business associated with the user.

It is noteworthy that any hardware platform suitable for performing the processing described herein is suitable for use with the technology. The terms "computer-readable storage medium" and "computer-readable storage media" as used herein refer to any medium or media that participate in providing instructions to a CPU for execution. Such media can take many forms, including, but not limited to, non-volatile media, volatile media and transmission media. Non-volatile media include, for example, optical or magnetic disks, such as a fixed disk. Volatile media include dynamic memory, such as system RAM. Transmission media include coaxial cables, copper wire and fiber optics, among others, including the wires that comprise one embodiment of a bus. Transmission media can also take the form of acoustic or light waves, such as those generated during radio frequency (RF) and infrared (IR) data communications. Common forms of computer-readable media include, for example, a floppy disk, a flexible disk, a hard disk, magnetic tape, any other magnetic medium, a CD-ROM disk, digital video disk (DVD), any other optical medium, any other physical medium with patterns of marks or holes, a RAM, a PROM, an EPROM, an EEPROM, a FLASHEPROM, any other memory chip or data exchange adapter, a carrier wave, or any other medium from which a computer can read.

Various forms of computer-readable media may be involved in carrying one or more sequences of one or more instructions to a CPU for execution. A bus carries the data to system RAM, from which a CPU retrieves and executes the instructions. The instructions received by system RAM can optionally be stored on a fixed disk either before or after execution by a CPU.

Computer program code for carrying out operations for aspects of the present technology may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The foregoing detailed description includes references to the accompanying drawings, which form a part of the detailed description. The drawings show illustrations in accordance with exemplary embodiments. These example embodiments, which are also referred to herein as "examples," are described in enough detail to enable those skilled in the art to practice the present subject matter. The embodiments can be combined, other embodiments can be utilized, or structural, logical, and electrical changes can be made without departing from the scope of what is claimed. The following detailed description is, therefore, not to be taken in a limiting sense, and the scope is defined by the appended claims and their equivalents.

In this document, the terms "a" or "an" are used, as is common in patent documents, to include one or more than one. In this document, the term "or" is used to refer to a nonexclusive "or," such that "A or B" includes "A but not B," "B but not A," and "A and B," unless otherwise indicated. Furthermore, all publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

The corresponding structures, materials, acts, and equivalents of all means or step plus function elements in the claims below are intended to include any structure, material, or act for performing the function in combination with other claimed elements as specifically claimed. The description of the present technology has been presented for purposes of illustration and description, but is not intended to be exhaustive or limited to the invention in the form disclosed. Many modifications and variations will be apparent to those of ordinary skill in the art without departing from the scope and spirit of the invention. Exemplary embodiments were chosen and described in order to best explain the principles of the present technology and its practical application, and to enable others of ordinary skill in the art to understand the invention for various embodiments with various modifications as are suited to the particular use contemplated.

While various embodiments have been described above, it should be understood that they have been presented by way of example only, and not limitation. The descriptions are not intended to limit the scope of the technology to the particular forms set forth herein. Thus, the breadth and scope of a preferred embodiment should not be limited by any of the above-described exemplary embodiments. It should be understood that the above description is illustrative and not restrictive. To the contrary, the present descriptions are intended to cover such alternatives, modifications, and equivalents as may be included within the spirit and scope of the technology as defined by the appended claims and otherwise appreciated by one of ordinary skill in the art. The scope of the technology should, therefore, be determined not with reference to the above description, but instead should be determined with reference to the appended claims along with their full scope of equivalents.

What is claimed is:

1. A system comprising:
   one or more processors and one or more memories, the one or more memories for storing executable instructions, the one or more processors for executing the instructions to implement the following:
      a first transmit encoder that receives information bits and outputs first encoded bits and first received samples of the information bits;
      a first receiver decoder that receives the first encoded bits and the first received samples and outputs a cyclic redundancy check (CRC) to a first buffer and a third buffer, the first encoded bits being decoded into first decoded bits;
      a second buffer that receives the information bits;
      a first feedback encoder that receives the first decoded bits, the CRC and decoder log-likelihood ratio (LLR) data from the first buffer, the first feedback encoder being configured to combine the first decoded bits, the CRC, and the decoder log-likelihood ratio (LLR) data into feedback, the first feedback encoder outputting the feedback and second received samples;
      a first feedback decoder that receives the feedback and the second received samples;
      a second transmit encoder that receives the feedback and the second received samples from the first feedback decoder and the information bits from the first buffer, the second transmit encoder outputting second encoded bits based on the information bits, the feedback, and the second received samples; and
      a second receiver decoder that receives the second encoded bits and third received samples from the second transmit encoder and the first decoded bits and the CRC from the third buffer, the second receiver decoder generating second decoded bits.

2. The system according to claim 1, wherein the first transmit encoder includes an encoder neural network, wherein feedback for training the encoder neural network includes the decoder log-likelihood ratio (LLR) data.

3. The system according to claim 2, wherein the encoder neural network is trained by applying an encoder constraint of the first transmit encoder.

4. The system according to claim 3, wherein a decoder neural network of the first receiver decoder is trained using the information bits, output of the first receiver decoder, the decoder log-likelihood ratio (LLR) data, and the first decoded bits, wherein the decoder neural network optimizes a loss function applied to the first decoded bits and the information bits.

5. The system according to claim 4, wherein the decoder neural network further is trained by applying a decoder constraint of the first receiver decoder, wherein the decoder constraint comprises any of received power or decoding rate.

6. The system according to claim 5, wherein the decoder neural network and the encoder neural network are trained simultaneously.

7. The system according to claim 6, wherein the first transmit encoder receives feedback comprising a re-transmit request, a portion of the first decoded bits that failed the CRC, the decoder log-likelihood ratio (LLR) data, and received samples associated with the portion of the first decoded bits that failed the CRC.

8. The system according to claim 7, wherein the second transmit encoder implements a second encoder neural network, wherein the second encoder neural network generates an updated forward error correcting code that is used to encode the information bits, the second transmit encoder transmitting the information bits encoded with the updated forward error correcting code to the second receiver decoder.

9. The system according to claim 8, wherein the first feedback encoder encodes the feedback prior to transmitting a first feedback.

10. A method comprising:
    receiving, by a first transmit encoder, information bits;
    outputting, by the first transmit encoder, first encoded bits and first received samples of the information bits;
    receiving, by a first receiver decoder, the first encoded bits and the first received samples;
    outputting, by the first receiver decoder, a cyclic redundancy check (CRC) to a first buffer and a third buffer, the first encoded bits being decoded into first decoded bits;
    receiving, by a second buffer, the information bits;
    receiving, by a first feedback encoder, the first decoded bits, the CRC and decoder log-likelihood ratio (LLR) data from the first buffer, the first feedback encoder being configured to combine the first decoded bits, the CRC, and the decoder log-likelihood ratio (LLR) data into feedback;
    outputting, by the first feedback encoder, the feedback and the second received samples;
    receiving, by a first feedback decoder, the first feedback and the second received samples;
    receiving, by a second transmit encoder, the feedback and the second received samples from the first feedback decoder and the information bits from the first buffer;
    outputting, by the second transmit encoder, second encoded bits based on the information bits, the feedback, and the second received samples;

receiving, by a second receiver decoder, the second encoded bits and third received samples from the second transmit encoder and the first decoded bits and the CRC from the third buffer; and generating, by the second receiver decoder, second decoded bits.

11. The method according to claim 10, further comprising training an encoder neural network of the first transmit encoder with feedback that includes decoder log-likelihood ratio (LLR) data.

12. The method according to claim 11, wherein training further comprises applying an encoder constraint of the first transmit encoder.

13. The method according to claim 12, further comprising training a decoder neural network of the first receiver decoder using the information bits, output of the first receiver decoder, the decoder log-likelihood ratio (LLR) data, and the first decoded bits, wherein the decoder neural network optimizes a loss function applied to the first decoded bits and the information bits.

14. The method according to claim 13, wherein training of the decoder neural network includes applying a decoder constraint of the first receiver decoder, wherein the decoder constraint comprises any of received power or decoding rate.

15. The method according to claim 14, wherein the decoder neural network and the encoder neural network are trained simultaneously.

16. The method according to claim 15, further comprising, receiving by the first transmit encoder, feedback comprising a re-transmit request, a portion of the first decoded bits that failed the CRC, the decoder log-likelihood ratio (LLR) data, and first received samples associated with the portion of the first decoded bits that failed the CRC.

17. The method according to claim 16, further comprising:

implementing, by the second transmit encoder, a second encoder neural network, wherein the second encoder neural network generates an updated forward error correcting code that is used to encode the information bits; and transmitting, by the second transmit encoder, the information bits encoded with the updated forward error correcting code to the second receiver decoder.

18. The method according to claim 17, further comprising encoding, by the first feedback encoder, the feedback prior to transmitting a first feedback.

19. A system comprising:

one or more processors and one or more memories, the one or more memories for storing executable instructions, the one or more processors for executing the instructions to implement the following:

a first transmit encoder that receives information bits and outputs first encoded bits and first received samples of the information bits;

a first receiver decoder that receives the first encoded bits and the first received samples and outputs a cyclic redundancy check (CRC) to a first buffer and a third buffer, the first encoded bits being decoded into first decoded bits, the first receiver decoder being configured to receive wirelessly transmitted encoded information bits, wherein the first transmit encoder is configured to obtain receiver samples, decoded bits from the first receiver decoder based on the first received samples, and decoder log-likelihood ratio (LLR) data from the first receiver decoder, the decoder LLR data including a logarithm of a ratio of a first probability and a second probability, the first probability being a probability that a bit from the decoded bits is 0, the second probability being a probability that the bit is 1, wherein an encoder neural network of the first transmit encoder receives parameters for training the encoder neural network that comprise the information bits and feedback from a wireless digital receiver including the decoded bits, the decoder LLR data, and the receiver samples, the encoder neural network being optimized using a loss function applied to the decoded bits and the information bits to calculate a forward error correcting code, wherein the loss function is one of a Hamming distance function or a quadratic loss function;

a second buffer that receives the information bits;

a first feedback encoder that receives the first decoded bits, the CRC and decoder log-likelihood ratio (LLR) data from the first buffer, the first feedback encoder being configured to combine the first decoded bits, the CRC, and the decoder log-likelihood ratio (LLR) data into feedback, the first feedback encoder outputting the feedback and second received samples;

a first feedback decoder that receives the feedback and the second received samples;

a second transmit encoder that receives the feedback and the second received samples from the first feedback decoder and the information bits from the first buffer, the second transmit encoder outputting second encoded bits based on the information bits, the feedback, and the second received samples; and a second receiver decoder that receives the second encoded bits and third received samples from the second transmit encoder and the first decoded bits and the CRC from the third buffer, the second receiver decoder generating second decoded bits.

* * * * *